(12) United States Patent
Anand et al.

(10) Patent No.: US 6,639,211 B1
(45) Date of Patent: Oct. 28, 2003

(54) CONTRAST-ENHANCED MRA INCLUDING AN EFFECTIVE ZERO-LATENCY METHOD OF BOLUS DETECTION

(75) Inventors: Christopher K. Anand, Chesterland, OH (US); Paul M. Margosian, Lakewood, OH (US); Michael R. Thompson, Cleveland Heights, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 412 days.

(21) Appl. No.: 09/718,746

(22) Filed: Nov. 22, 2000

(51) Int. Cl.[7] .......................... B01D 59/44; H01J 49/00; A61B 5/05; G01V 3/00; F16D 31/02
(52) U.S. Cl. .................. 250/282; 600/411; 600/414; 600/420; 324/307; 324/309; 60/410; 60/419; 60/420
(58) Field of Search ................... 600/411, 414, 600/420, 419; 324/307, 309; 60/410, 420, 419; 250/282

(56) References Cited

U.S. PATENT DOCUMENTS

| 5,122,747 A | | 6/1992 | Riederer et al. ............. 324/309 |
|---|---|---|---|
| 5,590,654 A | * | 1/1997 | Prince ......................... 600/420 |
| 5,713,358 A | | 2/1998 | Mistretta et al. ........... 128/653.2 |
| 5,912,557 A | | 6/1999 | Wilman et al. ............. 324/309 |
| 6,037,771 A | | 3/2000 | Liu et al. .................... 324/309 |
| 6,038,466 A | * | 3/2000 | Haselhoff ................... 600/410 |
| 6,044,290 A | | 3/2000 | Vigen et al. ................ 600/419 |
| 6,073,042 A | | 6/2000 | Simonetti et al. ........... 600/420 |

OTHER PUBLICATIONS

"Time–Resolved Contrast–Enhanced 3D MR Angiography", Korosec, et al. MRM 36:345–351 (1996).

* cited by examiner

*Primary Examiner*—John R. Lee
*Assistant Examiner*—Kalimah Fernandez
(74) *Attorney, Agent, or Firm*—Fay, Sharpe, Fagan, Minnich & McKee, LLP

(57) ABSTRACT

To generate a magnetic resonance angiograph, a patient is injected with a contrast-enhancing agent (210). An ellipsoidal central portion of k-space (300) and a first surrounding region (310) are continuously sampled (220). A portion of each central data set (300, 310) is reconstructed (230) into a low-resolution volume and maximum-intensity-projected (240) onto a line. The maximum intensity projection (240) is processed (250) in order to detect the arrival of the contrast enhancing bolus within a volume of interest. Upon detection of the arrival of the bolus, the acquisition of a high-resolution magnetic resonance angiograph is triggered (260) in which higher phase encode portions (310, 420) of k-space are sampled. The central data set (300) along with the higher phase encode views (310, 420) are reconstructed (290) into a high-resolution magnetic resonance angiogram. The present technique allows for substantially zero latency between the detection of the contrast-enhancing agent bolus and the acquisition of the magnetic resonance angiogram.

19 Claims, 5 Drawing Sheets

CONTRAST-ENHANCED MRA INCLUDING AN EFFECTIVE ZERO-LATENCY METHOD OF BOLUS DETECTION

BACKGROUND OF THE INVENTION

The present invention relates to the magnetic resonance arts. It finds particular application in conjunction with contrast-enhanced magnetic resonance angiography and will be described with particular reference thereto. It is to be appreciated, however, that the invention will also find application in conjunction with bolus detection in other magnetic resonance applications.

Measurement of blood flow, in vivo, is important for the functional assessment of the circulatory system. Angiography has become a standard technique for making such functional assessments. Magnetic resonance angiography (MRA) provides detailed angiographic images of the body in a non-invasive manner. In conventional MRA, which does not use contrast agents, magnetic resonance signal from flowing blood is optimized, while signal from stationary blood or tissue is suppressed. In contrast-enhanced MRA, a $T_1$-shortening contrast agent is injected into the blood stream in order to achieve contrast between flowing blood and stationary tissue. When data is collected using a short TR, short TE echo sequence, the blood appears bright, while the stationary tissue appears dark.

Current contrast-enhanced 3D MRA techniques produce excellent images of the arteries if the center of k-space is acquired during peak concentration of the contrast agent in the arteries. However, obtaining high quality images requires appropriate timing of the injection of the contrast agent relative to the start of image acquisition. If the center of k-space is acquired too early, maximum signal in the arteries will not be achieved. Conversely, if the center of k-space is acquired too late, the veins will be enhanced, causing the arteries to be obscured. Therefore, a premium is placed on reliable determination of bolus arrival.

In one prior art technique, a small trial volume of contrast agent is injected and a short two-dimensional acquisition is repeated at or near the region of interest to sense the arrival of the bolus of contrast agent. From this acquisition, the time of transit from the injection point to the region of interest is determined. A subsequent angiogram is started at the determined time after the injection of a full dose of the contrast agent. This technique is unreliable because the bolus travel time depends on variable patient factors, making the timing less than ideal. Inaccurate timing of bolus arrival produces a useless angiogram.

Another prior art technique sets up a short two-dimensional triggering acquisition upstream of the area of interest and a 3D time-of-flight acquisition at the area of interest. The contrast agent is injected and the triggering scan is repeated until the bolus is detected. After detection of the bolus, the 3D angiogram is started, with elliptical centric phase encoding from the center of k-space outward. This technique introduces the risk of false positives caused by patient motion. While false positives may be reduced by applying bimodal presats, the application of such bimodal presats increases sampling time and introduces additional latency between detection of the bolus and the angiogram acquisition.

Another prior art technique employs a 3D angiogram to generate a cine loop using view sharing, thus avoiding the need to detect the arrival of the bolus. However, this method requires a short total acquisition time for each frame in the cine loop in order to avoid unacceptable image artifacts and to ensure that the bolus is present for a significant portion of the acquisition. Ultimately, the short total acquisition time results in limited image resolution.

Therefore, a need exists for a contrast-enhanced magnetic resonance angiography method having zero latency between the detection of the bolus and the acquisition of a high-resolution magnetic resonance angiogram. The present invention contemplates a new and improved contrast-enhanced MRA method which overcomes the above-referenced problems and others.

SUMMARY OF THE INVENTION

In accordance with one aspect of the present invention, a method of magnetic resonance angiography (MRA) includes injecting a subject with a bolus of a magnetic resonance contrast agent upstream from a volume of interest. Magnetic resonance is excited in the volume of interest and magnetic resonance echoes, which generate magnetic resonance signals, are induced. A central portion of k-space is continuously sampled, creating a plurality of central data sets. The arrival of a leading edge of a bolus of contrast agent within the volume of interest is detected. After detecting the arrival of the leading edge of the bolus, portions of k-space peripheral to the central portion are sampled, creating peripheral data sets. A magnetic resonance angiograph is reconstructed from (i) the last central data set collected before the detection of the bolus and (ii) the peripheral data sets collected after the detection of the bolus.

In accordance with another aspect of the present invention, a method of acquiring a three-dimensional MRA within a volume of interest includes determining a trigger point within the volume of interest for a three-dimensional magnetic resonance data acquisition. An intravascular magnetic resonance contrast agent is administered to the patient's circulatory system so as to enhance magnetic resonance imaging of blood vessels. Magnetic resonance data is acquired from the volume of interest and the arrival of the leading edge of a bolus of contrast agent at a trigger point is detected from the acquired magnetic resonance data. After detecting the arrival of the bolus at the trigger point, a series of three-dimensional magnetic resonance acquisitions are performed. The acquired magnetic resonance data is then reconstructed into a three-dimensional magnetic resonance angiograph.

In accordance with another aspect of the present invention, a method of detecting the arrival of a bolus of magnetic resonance contrast-enhancing agent in a volume of interest includes continuously sampling a centrally encoded portion of k-space, generating a plurality of central data sets. A maximum intensity projection is generated from a portion of each central data set. The generated maximum intensity projection is compared to a predetermined projection threshold value. In response to the comparing step, either the sampling of higher phase encode portions of k-space is triggered or the current central data set is discarded and the above steps are repeated.

In accordance with another aspect of the present invention, a magnetic resonance angiography system (MRA) for imaging a subject into which a magnetic resonance contrast-enhancing agent is injected includes a magnet for generating a temporally constant magnetic field through a volume of interest. A radio frequency transmitter excites and inverts magnetic dipoles in the volume of interest to generate a train of magnetic resonance echoes. Gradient magnetic field coils and a gradient magnetic field controller generate at least phase and read magnetic field gradient pulses in orthogonal directions across the volume of interest. A receiver receives and demodulates the magnetic resonance echoes to produce a series of k-space views. The system further includes a central memory portion for storing centrally-encoded k-space views and a peripheral data memory portion for storing higher phase encode views which are peripherally around the central phase encode views. A bolus detection processor detects an arrival of a leading edge of a bolus of the contrast-enhancing agent. A reconstruction processor reconstructs at least a portion of the centrally encoded k-space views and the higher phase encode views.

In accordance with a more limited aspect of the present invention, the bolus detection processor includes a maximum intensity projection processor for processing at least a portion of the centrally encoded k-space views into a maximum intensity projection of a portion of the volume of interest through which the bolus enters the volume of interest onto a line. Further, an edge detector detects the arrival of the contrast-enhancing agent bolus from the projection.

One advantage of the present invention resides in a zero latency between detection of the bolus and the acquisition of the angiogram.

Another advantage of the present invention is that it improves the reliability of bolus arrival determinations.

Another advantage of the present invention resides in the reduction of patient-movement artifacts.

Another advantage of the present invention resides in more precise control of central phase encode view acquisition.

Still another advantage of the present invention is that it interleaves triggering views with high resolution views.

Other benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1A:
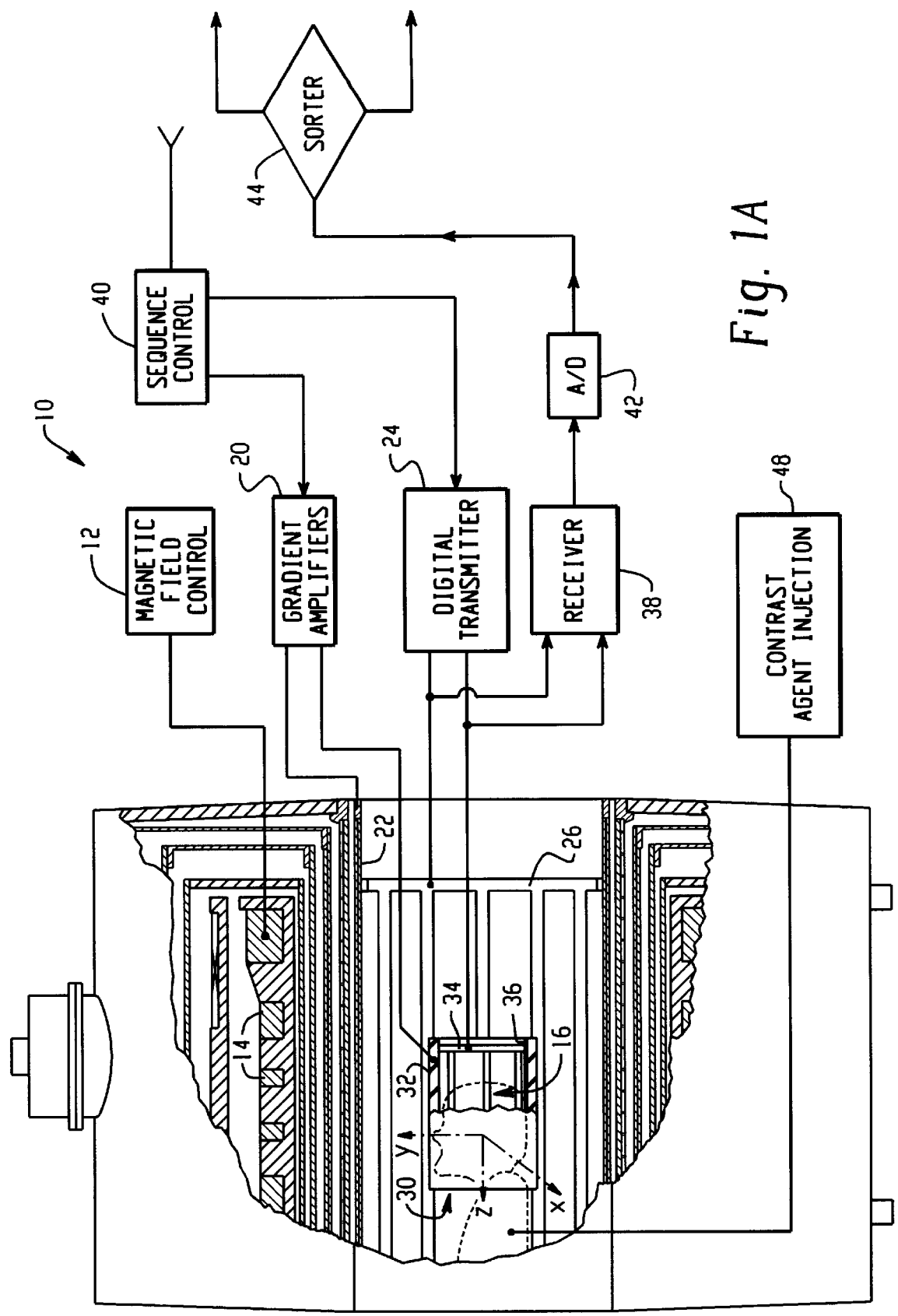
FIGS. 1A and 1B, taken together, are a diagrammatic illustration of a magnetic resonance angiography (MRA) apparatus in accordance with the present invention.
Figure 1B:
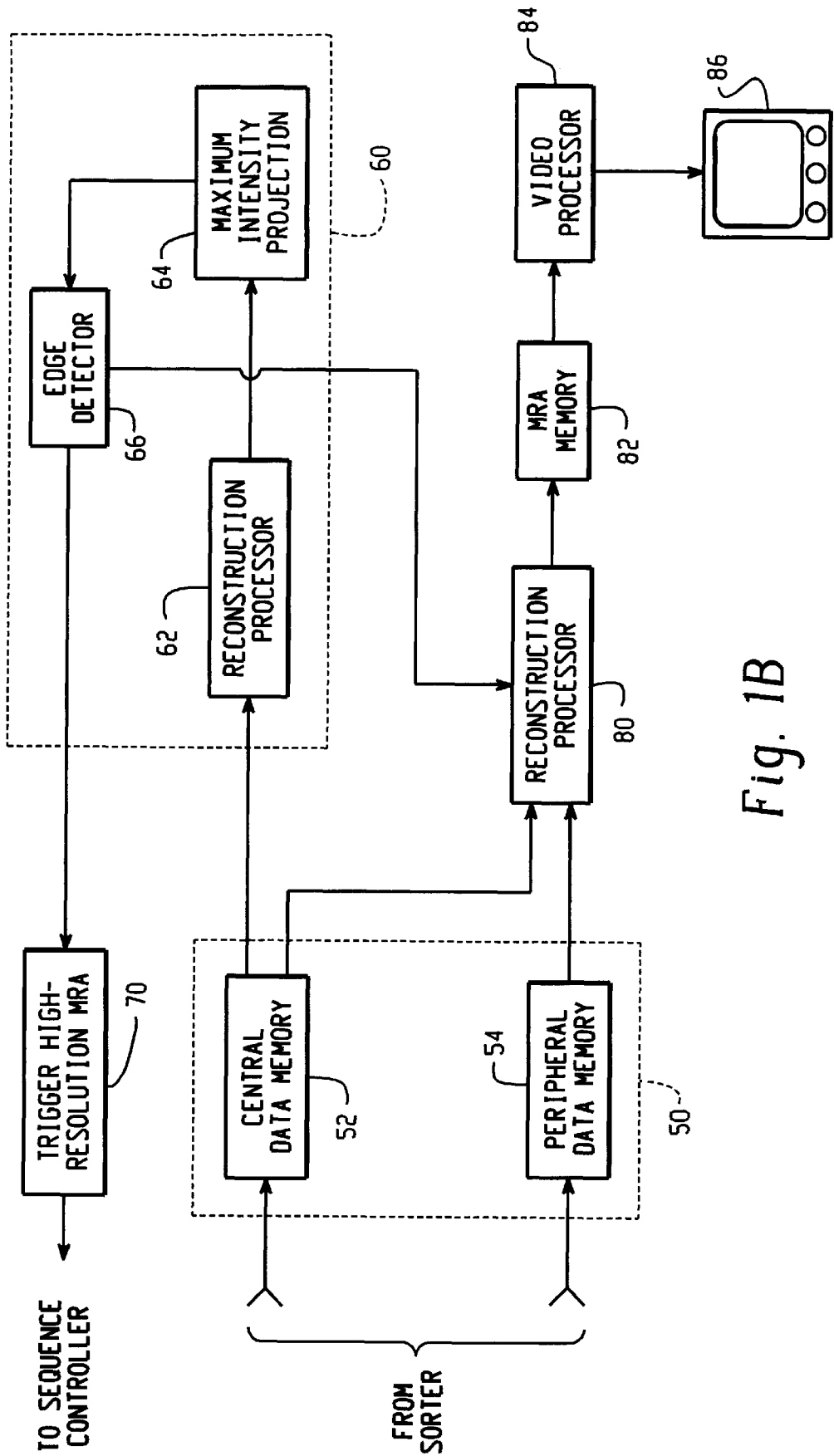

With reference to FIGS. 1A and 1B, a magnetic resonance imaging system 10 includes a main magnetic field control 12 which controls superconducting or resistive magnets 14 such that a substantially uniform, temporally constant magnetic field is created along a z-axis through an examination or image region 16. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, saturate spins, and the like in order to generate magnetic resonance imaging and spectroscopy sequences.

More specifically, gradient pulse amplifiers 20 apply current pulses to selected ones or pairs of whole body gradient coils 22 to create magnetic field gradients along x, y, and z-axes of the examination region. In other words, by selectively applying current pulses to appropriate ones of the gradient field coils, slice select, phase encode, and read gradients are selectively applied along mutually orthogonal axes. In two-dimensional imaging, the slice select gradients define an image slice or region and the phase encode and read gradients encode the magnetic resonance along mutually orthogonal axes within the slice. In three-dimensional imaging, a pair of phase encode gradients are applied to step in a plane orthogonal to the read direction. A digital radio frequency transmitter 24 transmits radio frequency pulses or pulse packets to a whole-body RF coil 26 to transmit RF pulses into the examination region. The RF pulses are used to saturate spins, excite resonance, invert magnetization, refocus resonance, or manipulate resonance in selected portions of the examination region. The resonance signals are picked up by the whole-body RF coil 26.

To generate images of limited regions of the subject, local coils are placed contiguous to the selected region. For example, an insertable head coil 30 is inserted surrounding a selected brain region at the isocenter of the bore. The insertable head coil 30 includes local gradient coils 32 which receive current pulses from the gradient amplifiers 20 to create magnetic field gradients along x, y, and z-axes in the examination region within the head coil 30. A local radio frequency coil 34 is used to excite magnetic resonance and receive magnetic resonance signals emanating from the patient's head. In one embodiment, the local coil is a surface or multiple loop array. Alternatively, a receive-only local radio frequency coil can be used to receive resonance signals induced by body-coil RF transmissions. An RF screen 36 blocks the RF signals from the RF head coil from inducing eddy currents in the gradient coils and surrounding structures. The resultant radio frequency signals which are picked-up by the whole-body RF coil 26, the local RF coil 34, or other specialized RF coils are demodulated by a receiver 38.

A sequence control processor or scan controller 40 controls the gradient pulse amplifiers 20 and the transmitter 24 to generate any of a plurality of multiple echo sequences, including echo-planar imaging, echo-volume imaging, gradient and spin echo imaging, fast spin echo imaging, and the like. For the selected sequence, the receiver 38 receives a plurality of data lines in rapid succession following each RF excitation pulse. Preferably, the receiver 38 is a digital receiver or, as shown in FIG. 1A, is accompanied by an analog-to-digital converter 42 for converting each data line into a digital format.

As is described more fully below, digital data lines are sorted by a sorter 44 between central data lines and peripheral data lines based on their particular phase encoding. As each magnetic resonance signal or echo is collected and/or sampled by the receiver 38 and analog-to-digital converter 42, the raw magnetic resonance data is loaded into an acquired data memory 50 or memory matrix, otherwise known as k-space. In other words, the acquisition of the magnetic resonance data is considered sampling of the three-dimensional k-space. Two of the dimensions, $k_y$ and $k_z$ are preferably sampled by applying different phase encoding gradients, $G_y$ and $G_z$, during each pulse sequence of the scan, and each acquired magnetic resonance signal contains multiple samples in the $k_x$ direction. The pulse sequence is repeated for as many repetitions as are necessary to sample all desired $k_y$ and $k_z$ values.

For magnetic resonance angiography (MRA) applications, a bolus of magnetic resonance contrast-enhancing agent is injected into the subject using conventional means 48. As will be described more fully below, the magnetic resonance imaging system may be used for MRA applications. In such applications, the MRA method includes a first detection and triggering phase during which a leading edge of the contrast-enhancing bolus is detected. Following detection of the bolus, a high-resolution three-dimensional angiogram is acquired with substantially zero latency between the detection of the bolus and the acquisition of the angiogram.

Figure 2:
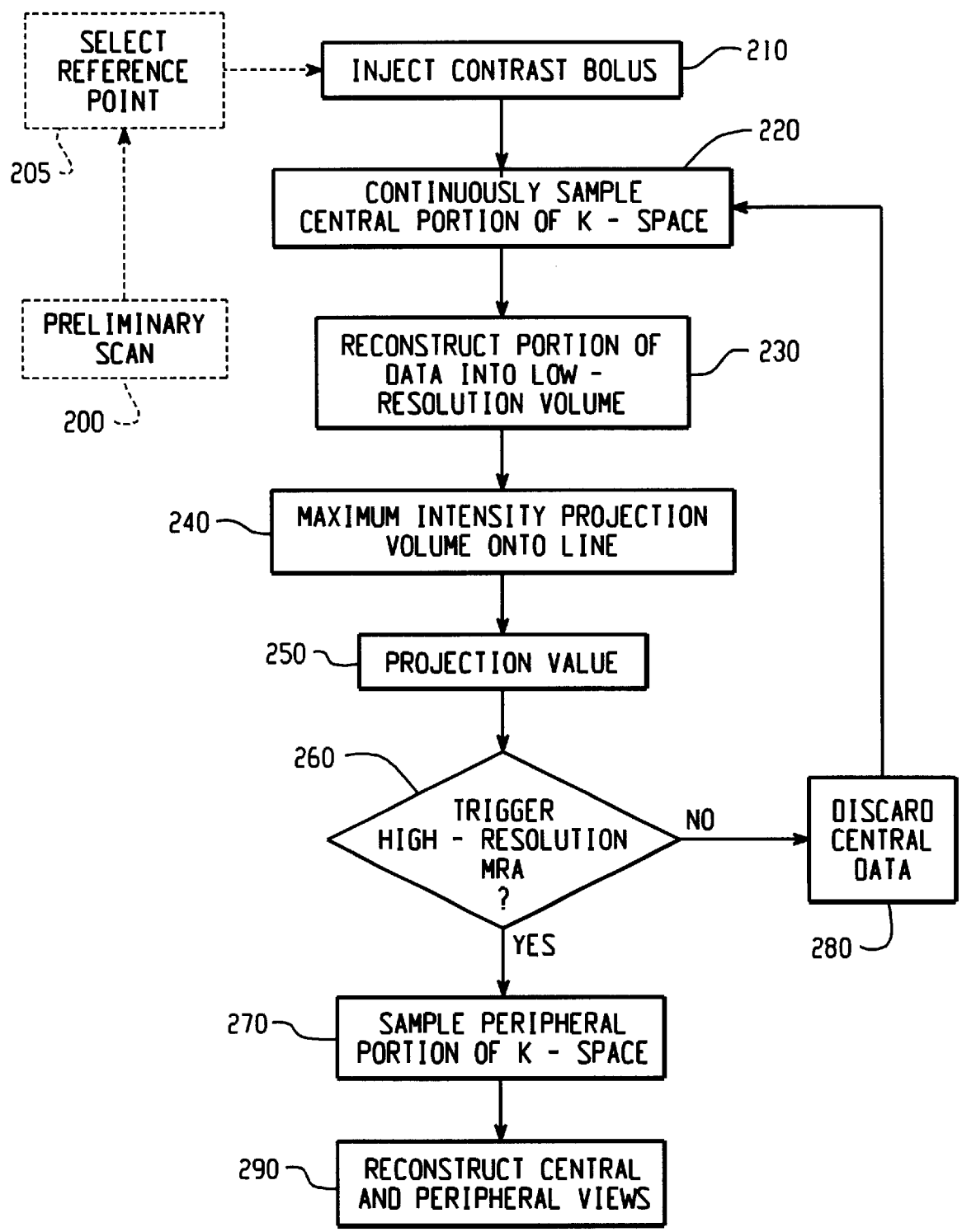
FIG. 2 is a flow chart illustrating one embodiment of the MRA method in accordance with the present invention.

With reference to FIG. 2, a MRA method includes injecting or otherwise administering a magnetic resonance contrast-enhancing agent to the blood vessels of the subject 210. Optionally, a preliminary scan 200 of the volume of interest is performed before injection of the contrast agent. In one embodiment, the preliminary scan includes setting up a 3D time-of-flight (TOF) magnetic resonance angiogram and acquiring one frame. From the one frame preliminary scan, the location of the vessel through which the bolus will enter the volume of interest is selected 205. Preferably, this reference point is selected using multi-planar reformatting.

Following the injection of the contrast agent, additional frames of the TOF angiogram are generated. More specifically, a central portion of the k-space for the selected volume of interest is continuously sampled 220 using a multiple-echo magnetic resonance sequence. In one embodiment, a two echo sequence is employed, while a four echo sequence is employed in another embodiment. It is to be appreciated that other multiple echo sequences may also be employed. In a preferred embodiment, step 220 includes acquiring a central ellipsoid of k-space repeatedly in an interleaved fashion. The method of interleaving is determined by the geometry of the blood vessel through which the contrast-enhancing bolus enters the volume of interest. For example, if the bolus enters through an artery parallel to the z-direction, a set of views $V_0=\{(k_y, k_z): k_y \text{ in } \ldots, 0, n, 2n, 3n, \ldots\}$ are acquired followed by $V_1=\{k_y, k_z): k_y$ in $\ldots, 1, n+1, 2n+1, 3n+1, \ldots\}$ and so on until all of the desired views are acquired. In one embodiment, a full set of views may be used to reconstruct frames of the volume of interest at a low-resolution, which frames may be displayed in a cine loop.

In another embodiment, a portion of the central data is reconstructed 230 into a low-resolution volume with a reduced field of view. The resulting low-resolution volume is maximum intensity projected 240 onto a line with a component parallel to the vessel through which the bolus enters, such as along the z-axis. It is to be appreciated that maximum intensity projections along the x or y-directions may also be generated in order to monitor the progress of the bolus. From the maximum intensity projections 240, a time-series analysis is performed, yielding a series of projection values 250, to detect a rising edge of the bolus. Before the bolus arrives, the same region is examined repeatedly and each of the projections can be expected to be substantially the same as the preceding projection. As the bolus enters the vessel, the intensity of the projection rises to a higher peak value at the maximus contrast agent concentration. The projection values 250 are compared to a predetermined projection threshold in order to detect the arrival of the bolus within the volume of interest. Preferably, a rising edge of the bolus followed by a plateau is detected which triggers the acquisition of a high-resolution magnetic resonance angiograph 260. In other words, if the acquired centrally encoded views indicate the arrival of the bolus, peripheral portions of k-space surrounding the central views are acquired 270. If the arrival of the bolus is not detected, the last acquired set of central views is discarded 280 and the method continues from step 220.

Upon detection of the contrast-enhancing bolus, higher phase encode views are acquired 270 using a multi-echo sequence in order to fill out k-space. Optionally, the switch to acquiring higher phase encode views occurs immediately upon detection of the bolus. In another embodiment, the switch occurs after a predetermined delay, corresponding to a number of views. Artisans will appreciate that the optional delay insures that the full contrast agent concentration has arrived in the volume of interest before the first views of step 270 are acquired. Preferably, the higher phase encode views are ellipsoidal tube in shape, surrounding the previously acquired centrally encoded ellipsoidal cylinder views. Following the acquisition of higher phase encode views, a magnetic resonance angiograph is reconstructed from (1) the central views acquired during the targeting phase (step 220), and (2) the higher phase encode views acquired after the arrival of the bolus.

Figure 3:
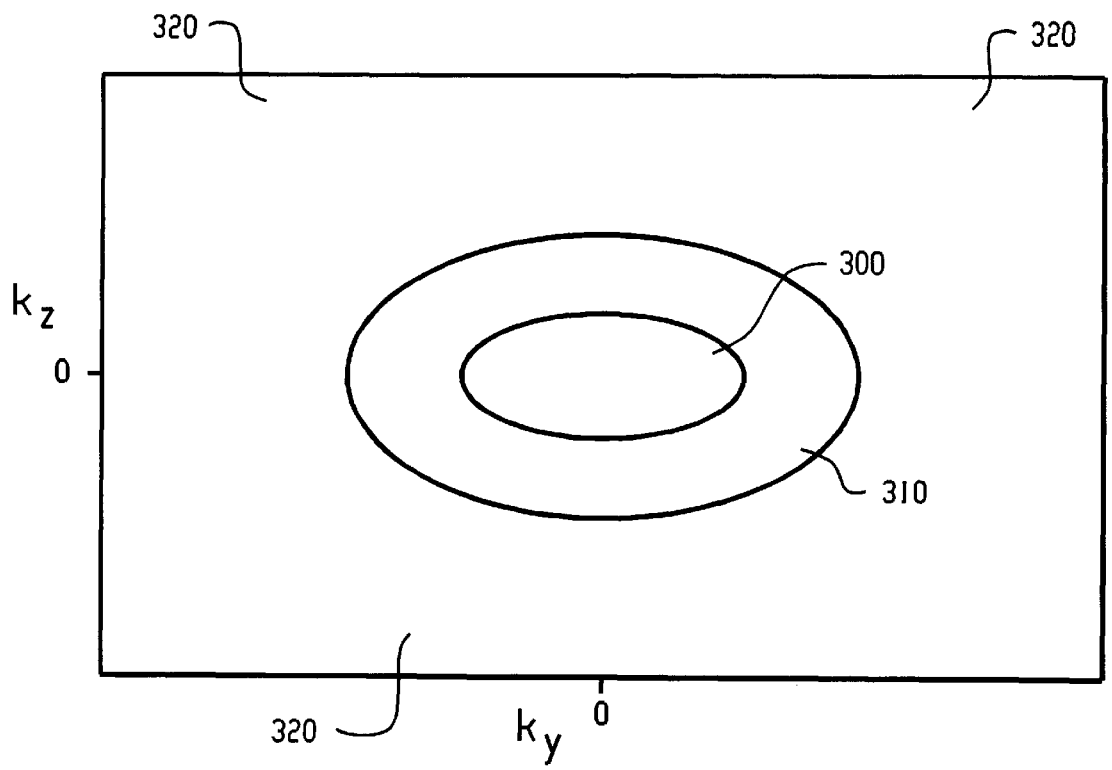
FIG. 3 is a graphical representation of a two-dimensional phase encode k-space plane illustrating k-space views acquired during a triggering phase in accordance with the present invention.
Figure 4:
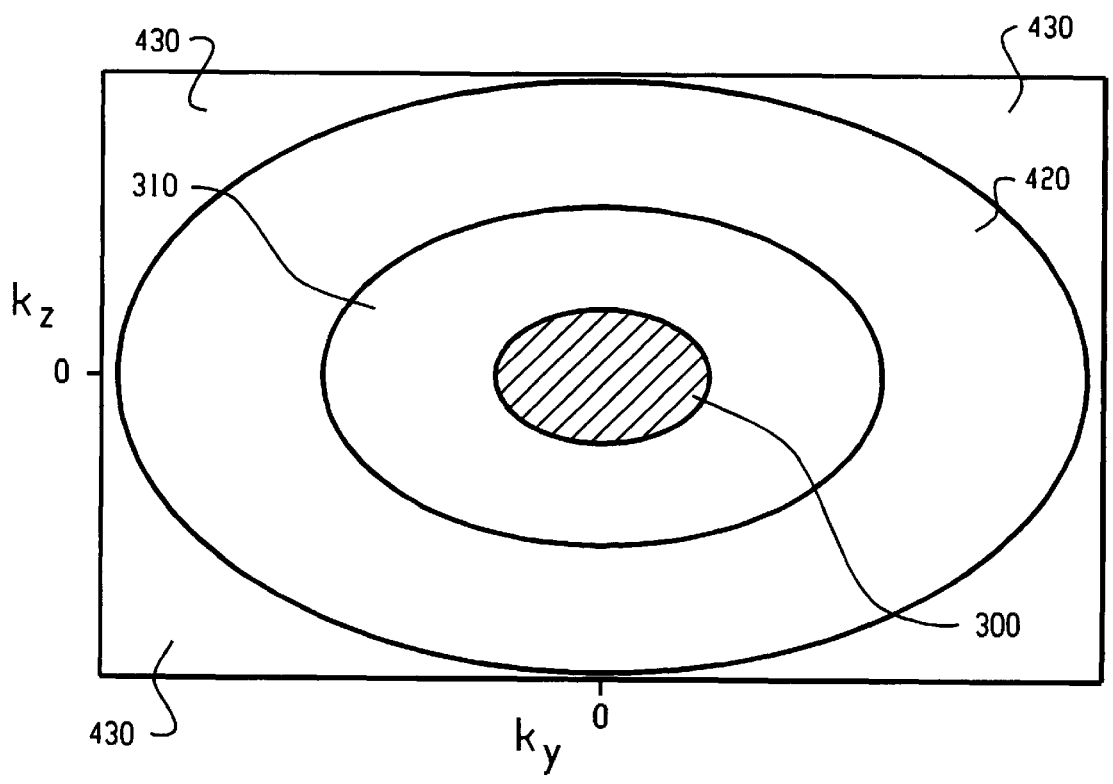
FIG. 4 is a graphical representation of a two-dimensional phase encode k-space plane illustrating peripheral k-space views acquired during a high-resolution phase in accordance with the present invention.

FIGS. 3 and 4 are graphical representations of phase encode k-space planes which illustrate the preferred views acquired during the MRA procedure. FIG. 3 illustrates the centrally encoded views that are collected during the triggering phase of the MRA procedure. More particularly, the centrally encoded data 300 is collected using a two echo sequence in which the first echo is encoded into the center of the k-space plane and the second echo is encoded in an annular or tubular region 310 peripherally around the first echo 300. It is to be appreciated that the remaining portion of k-space 320 is not sampled. As illustrated in FIG. 3, the centrally encoded views are ellipsoidal in cross-sectional shape. However, it is to be appreciated that other geometries, such as spherical and conical, are also contemplated.

Once the arrival of the bolus is detected, the phase encode views illustrated in FIG. 4 are acquired using a two echo sequence. More particularly, the first echo of the sequence is encoded in the annular region 310 of k-space peripherally around the cylindrical region 300 containing data from the centrally encoded first echo collected during the triggering phase. Further, the second echo of the sequence is encoded in another annular or tubular region 420 of k-space surrounding the first echo peripheral region 310. In other words, central views which were acquired from the second echo of the triggering phase (FIG. 3) are re-acquired from the first echo of the subsequent high-resolution phase (FIG. 4). It is to be appreciated that the remaining portions of k-space 430 are not sampled. In one embodiment, these unsampled portions of k-space are zero-filled. Preferably, the acquired views of the second phase are also ellipsoidal cylinders. However, other geometries are again contemplated.

Figure 5:
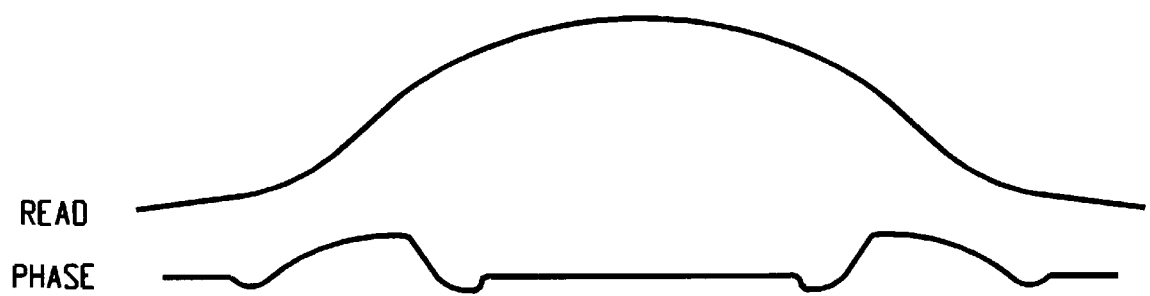
FIG. 5 is an exemplary gradient pulse sequence employed in accordance with the present invention; and, FIG. 6 is a graphical representation of one k-space scan trajectory employed in accordance with the present invention.
Figure 6:
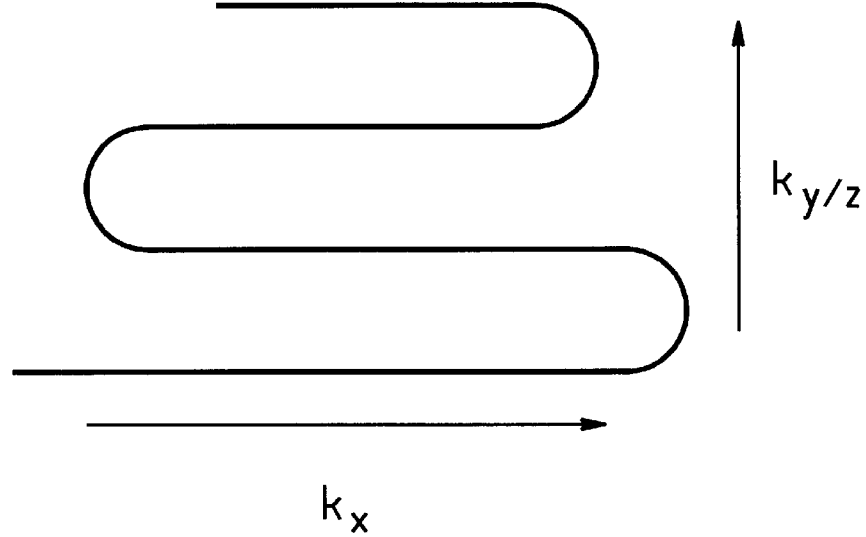

FIG. 5 illustrates one embodiment in which a multiple-echo gradient echo readout in which sinusoidal gradients are used. In this embodiment, phase encode gradients are overlapped with read gradients, and later echoes are time scaled accounting for the fact that less time is needed for phase encoding "blips," and less read points are needed for outer segments in order to cover an ellipsoid in k-space. FIG. 6 illustrates a preferred scan trajectory through k-space.

Referring again to FIG. 1B, the sorter 44 sorts centrally encoded views acquired during the triggering phase into a central data memory portion 52. Once the contrast-enhancing bolus is detected and higher phase encode views are collected, such views are sorted and stored in a peripheral data memory portion 54. Upon acquisition of a central set of views in regions 300 and 310, the central data set is transmitted to a bolus detection processor 60 in order to detect the arrival of the contrast-enhancing bolus. A portion of the central views are reconstructed 230 by a reconstruction processor 62 into a low-resolution, reduced field-of-view volume. This volume is maximum intensity projected (MIP) 240 by a projection processor 64 onto a line. An edge detector 66 uses a time series analysis to detect 250 a rising edge followed by a plateau, indicating the arrival of the bolus. In one embodiment, a projection value from the MIP is compared to a threshold projection value in order to detect the arrival of the leading edge of the bolus.

Upon detection of the bolus, the edge detector 66 signals a trigger 70 to trigger the sequence control processor 40 to acquire a plurality of higher phase encode views 270. As described above, the last set of central views from the triggering phase, following the bolus detection, is reconstructed 290 by a reconstruction processor 80 along with the higher phase encode views into a 3D magnetic resonance angiograph, which is stored in an MRA memory 82. The image may represent a planar slice through a blood vessel, an array of planar slices, a three-dimensional volume, or the like. The resulting MRA is processed by a video processor 84 for display on a monitor 86 or other human-viewable display.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance angiography comprising:
   (a) injecting a subject with a bolus of a magnetic resonance contrast agent upstream from a volume of interest;
   (b) exciting magnetic resonance in the volume of interest;
   (c) spatially encoding the excited resonance;
   (d) inducing spatially encoding magnetic resonance echoes, said echoes generating magnetic resonance signals;
   (e) continuously sampling a central region of k-space, creating a plurality of central data sets;
   (f) repeatedly reconstructing the central data sets into a series of low resolution images;
   (g) monitoring intensities from a portion of each low resolution image;
   (h) detecting the arrival of a leading edge of a bolus of the contrast agent within the volume of interest from the monitored low resolution image intensities;
   (i) after detecting the arrival of the leading edge of the bolus, sampling portions of k-space peripheral to the central portion of k-space, creating peripheral data sets; and,
   (j) reconstructing a magnetic resonance angiograph from (i) the central data set from the low resolution image in which the arrival of the bolus was detected, and (ii) the peripheral data sets collected after the detection of the bolus.

2. The method of magnetic resonance angiography according to claim 1, said method further comprising:
   discarding the central data sets in which the arrival of the bolus is not detected.

3. The method of magnetic resonance angiography according to claim 1, wherein the sampled central and peripheral portions of k-space are spatially encoded to cover a region ellipsoidal in cross-sectional shape.

4. The method of magnetic resonance angiography according to claim 1, wherein step (i) occurs following the detection of a rising edge of the bolus followed by a plateau of a predetermined duration.

5. A method of magnetic resonance angiography comprising:
   (a) injecting a subject with a bolus of a magnetic resonance contrast agent upstream from a volume of interest;
   (b) exciting magnetic resonance in the volume of interest;
   (c) inducing magnetic resonance echoes, said echoes generating magnetic resonance signals;
   (d) repeatedly sampling a central portion of k-space, creating a plurality of central data sets;
   (e) reconstructing a portion of each central data set into a low-resolution maximum intensity projection of an image representations;
   (f) determining the arrival of a leading edge of a bolus of the contrast agent within the volume of interest from the maximum intensity projection;
   (g) after detecting the arrival of the leading edge of the bolus, sampling portions of k-space peripheral to the central portion of k-space, creating peripheral data sets; and,
   (h) reconstructing a magnetic resonance angiograph from (i) the last central data set collected before sampling the peripheral data sets, and (ii) the peripheral data sets.

6. The method of magnetic resonance angiography according to claim 5, wherein unsampled portions of k-space outside of the central and peripheral portions are zero-filled.

7. The method of magnetic resonance angiography comprising:
   (a) injecting a subject with a bolus of a magnetic resonance contrast agent upstream from a volume of interest;
   (b) exciting magnetic resonance in the volume of interest;
   (c) inducing magnetic resonance echoes, said echoes generating magnetic resonance signals;
   (d) continuously sampling a central portion of k-space, creating a plurality of central data sets;
   (e) detecting the arrival of a leading edge of a bolus of the contrast agent within the volume of interest;
   (f) after detecting the arrival of the leading edge of the bolus, sampling portions of k-space peripheral to the central portion of k-space, creating peripheral data sets; and,
   (g) reconstructing a magnetic resonance angiograph from (i) the central data set from which arrival of the bolus was detected, and (ii) the peripheral data sets collected after the detection of the bolus;

(h) after detecting the arrival of the leading edge of the bolus, continuously sampling the central portion of k-space, creating a plurality of central data sets;

(i) interleaving the central data sets with the peripheral data sets;

(j) reconstructing the interleaved central and peripheral data sets into a series of cine magnetic resonance angiographs.

8. The method of magnetic resonance angiography according to claim 7, wherein steps (d) and (f) are carried out using a multi-echo sequence.

9. A method of acquiring a three-dimensional magnetic resonance angiograph within a volume of interest, said method comprising:

(a) determining a trigger point within the volume of interest for a three-dimensional magnetic resonance data acquisition;

(b) administering an intravascular magnetic resonance contrast agent to a patient's circulatory system in such a manner as to enhance magnetic resonance imaging of blood vessels;

(c) repeatedly acquiring spatially encoded magnetic resonance data from the volume of interest including a plurality of different magnetic resonance data views that span only a portion of k-space;

(d) reconstructing a series of low resolution images from the magnetic resonance data views;

(e) generating low resolution maximum intensity projections from the low resolution images;

(f) from the maximum intensity projections detecting a rising edge of the bolus;

(g) after detecting the rising edge of the bolus, performing a series of three-dimensional magnetic resonance acquisitions; and, (h) reconstructing data acquired during step (c) and step (g) into a three-dimensional magnetic resonance angiograph.

10. The method according to claim 9, wherein step (a) includes:

acquiring a preliminary magnetic resonance image of the volume of interest; and selecting a location within a blood vessel within the volume of interest through which the bolus will enter the volume of interest.

11. The method according to claim 9, therein step (c) includes:

continuously collecting ellipsoidally cross-sectioned sets of centrally encoded magnetic resonance k-space views.

12. The method according to claim 9, wherein step (c) further includes:

discarding the low resolution images from which the arrival of the leading edge of the bolus is not detected.

13. The method according to claim 9, wherein step (c) includes collecting centrally encoded magnetic resonance k-space views and step (g) includes collecting higher phase encode magnetic resonance k-space views peripheral around the centrally encoded magnetic resonance k-space views.

14. The method according to claim 13, wherein step (h) includes:

reconstructing (i) the centrally encoded magnetic resonance k-space views of the last low resolution image collected before step (g); and (ii) the higher phase encode magnetic resonance k-space views into a three-dimensional magnetic resonance angiograph.

15. In a magnetic resonance angiography (MRA) system, a method of detecting the arrival of a bolus of magnetic resonance contrast-enhancing agent in a volume of interest, said method comprising:

(a) continuously sampling a centrally encoded portion of k-space, generating a plurality of central data sets;

(b) reconstructing the plurality of central data sets into a series of reduced resolution images;

(c) generating a maximum intensity projection from at least a portion of each reduced resolution image;

(d) comparing the generated maximum intensity projection to a predetermined projection threshold value; and (e) in response to the comparing step, one of (i) triggering the sampling of higher phase encode portions of k-space, and (ii) discarding the current central data set and repeating steps (a) through (d).

16. The method according to claim 15, wherein step (a) is carried out using a multi-echo magnetic resonance sequence.

17. The method according to claim 15, wherein the sampled central and higher phase encode portions of k-space are ellipsoidal in cross-section.

18. An MRA system for imaging a subject into which a magnetic resonance contrast-enhancing agent is infected, the system including a magnet for generating a temporally constant magnetic field through a volume of interest, a radio frequency transmitter for exciting and inverting magnetic dipoles in the volume of interest to generate a train of magnetic resonance echoes, and gradient magnetic field coils and a gradient magnetic field controller for generating at least phase and read magnetic field gradient pulses in orthogonal directions across the volume of interest, a receiver for receiving and demodulating the magnetic resonance echoes to produce a series of k-space views, the system further comprising:

a central data memory portion for storing a plurality of centrally encoded k-space views;

a peripheral data memory portion for storing higher phase encode views which are peripherally around the central phase encode views;

a bolus detection processor for detecting an arrival of a leading edge of a bolus of the contrast-enhancing agent, the bolus detection processor including:

a maximum intensity projection processor for processing at least a portion of the plurality of centrally encoded k-space views into maximum intensity projections of a portion of the volume of interest through which the bolus enters the volume of interest onto a line; and, an edge detector for detecting the arrival of the contrast-enhancing agent bolus from the maximum intensity projections;

a reconstruction processor for reconstructing at least a portion of (i) the plurality of centrally encoded k-space views, and (ii) the higher phase encode views.

19. The MRA system according to claim 18, wherein the peripheral views which are reconstructed are acquired upon detection of the arrival of the contrast-enhancing agent bolus.

* * * * *